US009628073B2

United States Patent
Wasekura et al.

(10) Patent No.: US 9,628,073 B2
(45) Date of Patent: Apr. 18, 2017

(54) CURRENT CONTROL CIRCUIT

(71) Applicant: TOYOTA JIDOSHA KABUSHIKI KAISHA, Toyota-shi, Aichi-ken (JP)

(72) Inventors: Masaki Wasekura, Toyota (JP); Yosuke Osanai, Toyota (JP); Ayuki Koishi, Kani (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/853,034

(22) Filed: Sep. 14, 2015

(65) Prior Publication Data
US 2016/0079974 A1    Mar. 17, 2016

(30) Foreign Application Priority Data
Sep. 16, 2014   (JP) ................................. 2014-187725

(51) Int. Cl.
H03K 17/56    (2006.01)
H03K 17/567   (2006.01)
H03K 17/16    (2006.01)

(52) U.S. Cl.
CPC ......... *H03K 17/567* (2013.01); *H03K 17/165* (2013.01); *H03K 17/168* (2013.01)

(58) Field of Classification Search
CPC ... H03K 17/567; H03K 17/165; H03K 17/168
See application file for complete search history.

(56) References Cited

U.S. PATENT DOCUMENTS

| 8,704,556 B2* | 4/2014 | Hamanaka ........... H03K 17/567 327/109 |
| 8,766,671 B2* | 7/2014 | Senda ................ H03K 17/0406 327/108 |
| 2012/0025897 A1 | 2/2012 | Wasekura |
| 2014/0062541 A1 | 3/2014 | Wasekura |
| 2015/0358019 A1 | 12/2015 | Wasekura |

FOREIGN PATENT DOCUMENTS

| CN | 102893525 A | 1/2013 |
| JP | 2006324963 A | 11/2006 |
| JP | 2012135144 A | 7/2012 |
| JP | 2015-231117 A | 12/2015 |
| WO | 2012014314 A1 | 2/2012 |

* cited by examiner

*Primary Examiner* — Jung Kim
(74) *Attorney, Agent, or Firm* — Andrews Kurth Kenyon LLP

(57) ABSTRACT

A current control circuit includes a first drive switching device, a gate power source, a control switching device, a first resistor, an operational amplifier, and a switching circuit. The operational amplifier includes: an output terminal connected to the control switching device; a non-inverting input terminal; and an inverting input terminal configured to receive a reference potential. The switching circuit is configured to: input a value based on a potential difference between both ends of the first resistor to the non-inverting input terminal when a current flowing through the first drive switching device is equal to or smaller than a threshold level; and input a value based on a potential on a current pathway between the control switching device and the first drive switching device to the non-inverting input terminal when the current flowing through the first drive switching device is greater than the threshold level.

6 Claims, 7 Drawing Sheets

CURRENT CONTROL CIRCUIT

CROSS-REFERENCE TO RELATED APPLICATION

This application claims priority to Japanese Patent Application No. 2014-187725 filed on Sep. 16, 2014, the contents of which are hereby incorporated by reference into the present application.

TECHNICAL FIELD

The present invention relates to a current control circuit.

DESCRIPTION OF RELATED ART

WO 2012/014314 A1 discloses a circuit that controls a potential of a gate of an IGBT. This circuit has a pMOS and a resistor connected in series between the gate of the IGBT and a drive power source. An operational amplifier is connected to a gate of the pMOS. The pMOS is controlled by the operational amplifier such that a drain voltage of the pMOS becomes constant. Due to this, the potential of the gate of the IGBT is raised to a predetermined value.

SUMMARY

In the technology of WO2012/014314 A1, a rising rate of the gate potential of the IGBT is determined by a slew rate of the operational amplifier. Since great variations in the slew rate among operational amplifiers are produced, in the current control circuit of WO 2012/014314 A1, variations in the rising rate of the gate potential among the IGBTs are produced, with a result of which variations in timing when each IGBT is turned on are produced. Hence, a current control circuit is provided, which can control a gate potential of a switching device by an operational amplifier while reducing an effect caused by a slew rate of the operational amplifier.

The inventors of the present application have considered to control a turn-on timing of a drive switching device being a target to be controlled (the IGBT in the above example) by accurately controlling the rising rate of the gate potential when a gate of the drive switching device is charged. In the process thereof, it has been found that after a current has started to flow through the drive switching device, a switching loss in the drive switching device can be reduced by raising the gate potential as fast as possible.

A first current control circuit disclosed herein comprises: a first drive switching device, a gate power source, a control switching device, a first resistor, an operational amplifier, and a switching circuit. The control switching device and the first resistor are connected in series between the gate power source and a gate of the first drive switching device. The operational amplifier includes an output terminal, a non-inverting input terminal, and an inverting input terminal. The output terminal is connected to a gate of the control switching device. The inverting input terminal is configured to receive a reference potential. The switching circuit is configured to: input a value based on a potential difference between both ends of the first resistor to the non-inverting input terminal of the operational amplifier in a case where a current flowing through the first drive switching device while the gate of the first drive switching device is being charged is equal to or smaller than a threshold level; and input a value based on a potential on a current pathway between the control switching device and the gate of the first drive switching device to the non-inverting input terminal in a case where the current flowing through the first drive switching device while the gate of the first drive switching device is being charged is greater than the threshold level.

As the value based on the potential difference between both ends of the first resistor, a value obtained by calculation based on the potential difference between both ends of the first resistor may be adopted. For example, a value obtained by multiplying the potential difference between both ends of the first resistor by a constant number may be used. The potential on the current pathway between the control switching device and the gate of the first drive switching device may be a potential at any point on the current pathway. As the value based on the potential on the current pathway, a value obtained by calculation based on the potential on the current pathway may be adopted. For example, a value obtained by multiplying the potential on the current pathway by a constant number may be used.

In this current control circuit, when the gate of the first drive switching device is charged, the control switching device is controlled by the operational amplifier. In a case where the current flowing through the first drive switching device is equal to or smaller than the threshold level, the operational amplifier controls the control switching device such that the value based on the potential difference between both ends of the first resistor becomes equal to the reference potential. In other words, the operational amplifier controls the control switching device such that the gate current of the first drive switching device becomes substantially constant. Hence, the rising rate of the gate potential becomes substantially constant, and thus it is possible to accurately control a timing when the current starts to flow through the first drive switching device (that is, the timing when the first drive switching device is turned on). When the current has started to flow through the drive switching device, and the current flowing through the first drive switching device has become greater than the threshold level, the operational amplifier controls the control switching device such that the potential on the current pathway between the control switching device and the gate of the first drive switching device becomes equal to the reference potential. In other words, the operational amplifier controls the control switching device such that the gate potential of the first drive switching device is raised to the reference potential. Here, the operational amplifier raises the gate potential at a fast rate corresponding to the slew rate. Hence, it is possible to reduce a switching loss produced in the first drive switching device. Since great variations in the slew rate among the operational amplifiers are produced, great variations in the rising rate of the gate potential are produced at this time. However, since the drive switching device has already been substantially in an on-state (that is, in a state where the current can flow), problem hardly occurs even in the presence of the variations in the rising rate of the gate potential. As described above, with this current control circuit, it is possible to accurately control the timing when the drive switching device is turned on, and to reduce the switching loss produced in the drive switching device.

A second current control circuit disclosed herein comprises: a first drive switching device, a gate power source, a control switching device, a first resistor, an operational amplifier, and a switching circuit. The control switching device is connected between the gate power source and a gate of the first drive switching device. The first resistor is connected between the control switching device and the gate of the first drive switching device. The operational amplifier includes an output terminal, an inverting input terminal, and a non-inverting input terminal. The output terminal is connected to a gate of the control switching device. The non-inverting input terminal is configured to receive a potential of a terminal of the control switching device on a first drive switching device side. The switching circuit is configured to: input a potential to the inverting input terminal of the operational amplifier in a case where a current flowing through the first drive switching device while the gate of the first drive switching device is being charged is equal to or smaller than a threshold level. The potential is a sum of a potential of a terminal of the first resistor on the first drive switching device side and a first reference potential; and input a second reference potential to the inverting input terminal of the operational amplifier in a case where the current flowing through the first drive switching device while the gate of the first drive switching device is being charged is greater than the threshold level.

Also in this current control circuit, in the case where the current flowing through the first drive switching device while the gate of the first drive switching device is being charged is equal to or smaller than the threshold level, the rising rate of the gate potential is controlled to be a predetermined value. When the current flowing through the first drive switching device is greater than the threshold level, the gate potential is raised at a fast rate corresponding to the slew rate. Hence, with this current control circuit, it is possible to accurately control the timing when the drive switching device is turned on, and to reduce the switching loss produced in the drive switching device.

A third current control circuit disclosed herein comprises: a first drive switching device, a gate power source, a control switching device, a first resistor, and an operational amplifier. The control switching device and the first resistor are connected in series between the gate power source and a gate of the first drive switching device. The operational amplifier includes an output terminal connected to a gate of the control switching device. The operational amplifier is configured to: control a potential of the gate of the control switching device so that a potential difference between both ends of the first resistor does not exceed a first reference value, in a case where a current flowing through the first drive switching device while the gate of the first drive switching device is being charged is equal to or smaller than a threshold level; and control the potential of the gate of the control switching device so that a potential on a current pathway between the control switching device and the gate of the first drive switching device is changed to a second reference value, in a case where the current flowing through the first drive switching device while the gate of the first drive switching device is being charged is greater than the threshold level.

Also in this current control circuit, in a case where the current flowing through the first drive switching device while the gate of the first drive switching device is charged is equal to or smaller than the threshold level, the rising rate of the gate potential is controlled to be a predetermined value. When the current flowing through the first drive switching device is greater than the threshold level, the gate potential is raised at a fast rate corresponding to the slew rate. Hence, with this current control circuit, it is possible to accurately control the timing when the drive switching device is turned on and to reduce the switching loss produced in the drive switching device.

DETAILED DESCRIPTION

First Embodiment

Figure 1:
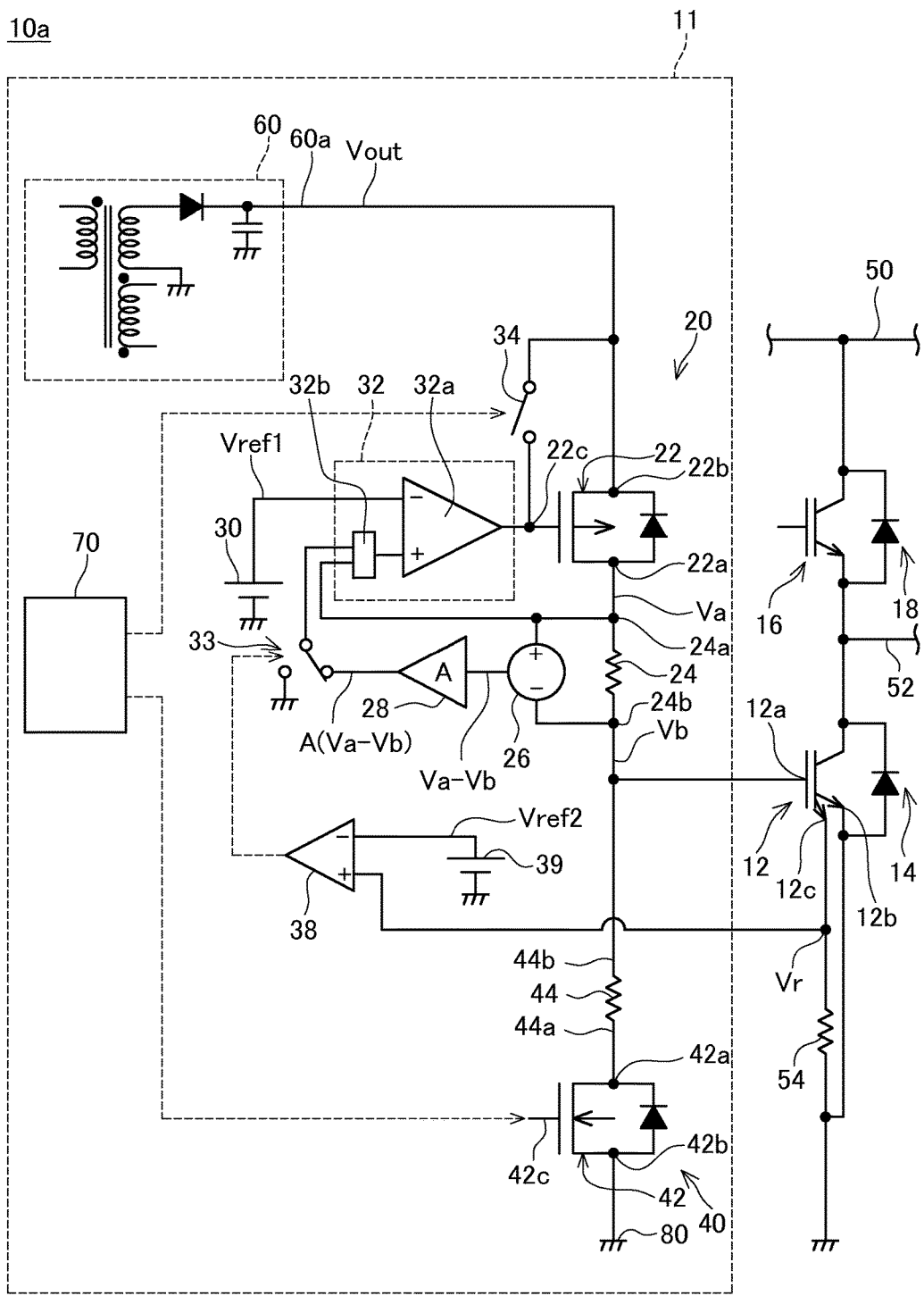
FIG. 1 is a circuit diagram of a current control circuit 10a in a first embodiment.

A current control circuit 10a in the first embodiment shown in FIG. 1 includes an IGBT 12, a diode 14, an IGBT 16 and a diode 18. The IGBT 12, the diode 14, the IGBT 16 and the diode 18 are parts of a three-phase inverter circuit. The diode 14 is connected in anti-parallel to the IGBT 12. In other words, an anode of the diode 14 is connected to an emitter 12b of the IGBT 12, and a cathode of the diode 14 is connected to a collector of the IGBT 12. The diode 18 is connected in anti-parallel to the IGBT 16. In other words, an anode of the diode 18 is connected to an emitter of the IGBT 16, and a cathode of the diode 18 is connected to a collector of the IGBT 16. The collector of the IGBT 16 is connected to a high-potential wiring 50 of the inverter circuit. The emitter of the IGBT 16 is connected to the collector of the IGBT 12. The emitter 12b of the IGBT 12 is connected to the ground. A motor wiring 52 is connected between the emitter of the IGBT 16 and the collector of the IGBT 12. The other end of the motor wiring 52 is connected to an unillustrated three-phase motor. In other words, the current control circuit corresponding to one phase of the three-phase inverter is configured by the IGBT 12, the diode 14, the IGBT 16 and the diode 18. The IGBT 16 and the diode 18 are devices located on an upper arm, and the IGBT 12 and the diode 14 are devices located on a lower arm. The IGBT 12 includes a sense emitter 12c in addition to the emitter 12b. The sense emitter 12c is an emitter through which a current smaller than that of the emitter 12b and having a substantially constant ratio with respect to a current flowing through the emitter 12b flows. The sense emitter 12c is connected through a resistor 54 to the ground. A gate 12a of the IGBT 12 is connected to a gate potential control circuit 11. A gate of the IGBT 16 is connected to an unillustrated gate potential control circuit.

The gate potential control circuit 11 controls a potential of the gate 12a of the IGBT 12. The gate potential control circuit 11 includes a gate charge circuit 20, a gate discharge circuit 40, an isolated power source 60 and a control device 70.

The isolated power source 60 outputs a potential Vout to an output terminal 60a. The potential Vout is the highest potential in the gate potential control circuit 11.

The gate charge circuit 20 is a circuit for supplying electric charges to the gate 12a of the IGBT 12 to turn on the IGBT 12. The gate charge circuit 20 includes a pMOS 22, a resistor 24, a subtractor 26, an amplifier 28, a reference power source 30, an operational amplifier IC 32, a switch 34, an interruption element 33, an operational amplifier 38 and a reference power source 39.

The pMOS 22 and the resistor 24 are connected in series between the gate 12a of the IGBT 12 and the output terminal 60a of the isolated power source 60. The pMOS 22 is connected closer to the isolated power source 60 than the resistor 24. A source 22b of the pMOS 22 is connected to the output terminal 60a of the isolated power source 60. A drain 22a of the pMOS 22 is connected to a terminal 24a of the resistor 24. A terminal 24b of the resistor 24 is connected to the gate 12a of the IGBT 12. Herein, a potential Va shown in FIG. 1 is a potential of the terminal 24a of the resistor 24 and is equal to a potential of the drain 22a of the pMOS 22. A potential Vb shown in FIG. 1 is a potential of the terminal 24b of the resistor 24 and is equal to a potential of the gate 12a of the IGBT 12.

A plus terminal of the subtractor 26 is connected to the terminal 24a of the resistor 24. A minus terminal of the subtractor 26 is connected to the terminal 24b of the resistor 24. An output terminal of the subtractor 26 is connected to the amplifier 28. The subtractor 26 outputs, from the output terminal thereof, a potential Va−Vb (that is, a potential difference between both ends of the resistor 24) obtained by subtracting the potential Vb of the terminal 24b from the potential Va of the terminal 24a.

An input terminal of the amplifier 28 is connected to the output terminal of the subtractor 26. An output terminal of the amplifier 28 is connected to the interruption element 33. The amplifier 28 outputs a potential obtained by multiplying the output potential Va−Vb of the subtractor 26 by A-fold. The A is a constant larger than 1. The output potential A(Va−Vb) of the amplifier 28 is input to the interruption element 33.

The interruption element 33 includes two input terminals (a first input terminal and a second input terminal) and one output terminal. The first input terminal of the interruption element 33 is connected to the output terminal of the amplifier 28. The second input terminal of the interruption element 33 is connected to the ground. The output terminal of the interruption element 33 is connected to the operational amplifier IC 32. The interruption element 33 switches a connection state based on a signal from the operational amplifier 38. The interruption element 33 switches the connection state between a first state where the first input terminal is connected to the output terminal and the second input terminal is disconnected from the output terminal, and a second state where the second input terminal is connected to the output terminal and the first input terminal is disconnected from the output terminal. In the first state, the output potential A(Va−Vb) of the amplifier 28 is input from the interruption element 33 to the operational amplifier IC 32. In the second state, a ground potential (0V) is input from the interruption element 33 to the operational amplifier IC 32.

A positive terminal of the reference power source 30 is connected to the operational amplifier IC 32. A negative terminal of the reference power source 30 is connected to the ground. The reference power source 30 outputs a reference potential Vref1. In the present specification, the reference potential means a fixed potential.

The operational amplifier IC 32 is an IC that includes an operational amplifier 32a and a selector 32b. The potential Va of the terminal 24a of the resistor 24 and the output potential of the interruption element 33 are input to the selector 32b. As described above, the output potential of the interruption element 33 is either one of the potential A(Va−Vb) and the ground potential. The selector 32b outputs a higher potential between the potential Va and the output potential of the interruption element 33.

The output potential of the selector 32b (that is, the higher potential one of the potential Va and the output potential of the interruption element 33) is input to a non-inverting input terminal of the operational amplifier 32a. The reference potential Vref1 is input to an inverting input terminal of the operational amplifier 32a. The output terminal of the operational amplifier 32a is connected to a gate 22c of the pMOS 22. When the potential of the non-inverting input terminal is higher than the potential of the inverting input terminal, the operational amplifier 32a outputs a plus potential, whereas when the potential of the inverting input terminal is higher than the potential of the non-inverting input terminal, the operational amplifier 32a outputs a minus potential. Due to this, the operational amplifier 32a controls the potential of the gate 22c of the pMOS 22 such that the potential input to the non-inverting input terminal is equal to the potential input to the inverting input terminal.

The switch 34 is connected between the source 22b and the gate 22c of the pMOS 22. The switch 34 switches a current pathway between the source 22b and the gate 22c to be in either a conductive state or an interruption state. The switch 34 is controlled by a signal from the control device 70.

The non-inverting input terminal of the operational amplifier 38 is connected to the sense emitter 12c (that is, the high-potential side wiring of the resistor 54) of the IGBT 12. Since the other end of the resistor 54 is connected to the ground, a potential Vr input to the non-inverting input terminal of the operational amplifier 38 is proportional to a current flowing through the resistor 54. The current flowing through the resistor 54 is equal to a current flowing through the sense emitter 12c of the IGBT 12. As described above, the current flowing through the sense emitter 12c has a substantially constant ratio with respect to the current flowing through the emitter 12b of the IGBT 12. Hence, the potential Vr input to the non-inverting input terminal of the operational amplifier 38 is substantially proportional to a current flowing between the collector and the emitter of the IGBT 12. The inverting input terminal of the operational amplifier 38 is connected to the reference power source 39. The reference power source 39 outputs a reference potential Vref2. When the potential Vr input to the non-inverting input terminal is lower than the potential Vref2 input to the inverting input terminal, the operational amplifier 38 controls the interruption element 33 such that the interruption element 33 is in the first state, whereas when the potential Vr is higher than the reference potential Vref2, the operational amplifier 38 controls the interruption element 33 such that the interruption element 33 is in the second state. In other words, when the current flowing through the IGBT 12 is lower than a threshold level corresponding to the reference voltage Vref2, the operational amplifier 38 controls the interruption element 33 such that the interruption element 33 is in the first state, whereas when the current flowing through the IGBT 12 is higher than the threshold level, the operational amplifier 38 controls the interruption element 33 such that the interruption element 33 is in the second state.

The gate discharge circuit 40 comprises a resistor 44 and an nMOS 42. The resistor 44 and the nMOS 42 are connected in series between the gate 12a of the IGBT 12 and the ground 80. The nMOS 42 is arranged closer to the ground 80 than the resistor 44. The source 42b of the nMOS 42 is connected to the ground 80. The drain 42a of the nMOS 42 is connected to a terminal 44a of the resistor 44. A gate 42c of the nMOS 42 is connected to the control device 70. The nMOS 42 performs switching according to a signal from the control device 70. A terminal 44b of the resistor 44 is connected to the gate 12a of the IGBT 12. When the control device 70 turns on the nMOS 42, the gate 12a of the IGBT 12 is connected to the ground 80, and then the IGBT 12 is turned off.

The control device 70 controls the switch 34 and the nMOS 42.

An operation of the current control circuit 10a will be described next. In a state where the IGBT 12 on the lower arm is off, when the IGBT 16 on the upper arm is turned from on to off, the diode 18 is turned on, and thus a current flows from the motor wiring 52 to the high-potential wiring 50. Thereafter, the IGBT 12 on the lower arm is turned from off to on. In this case, the gate potential control circuit 11 operates as follows.

Figure 2:
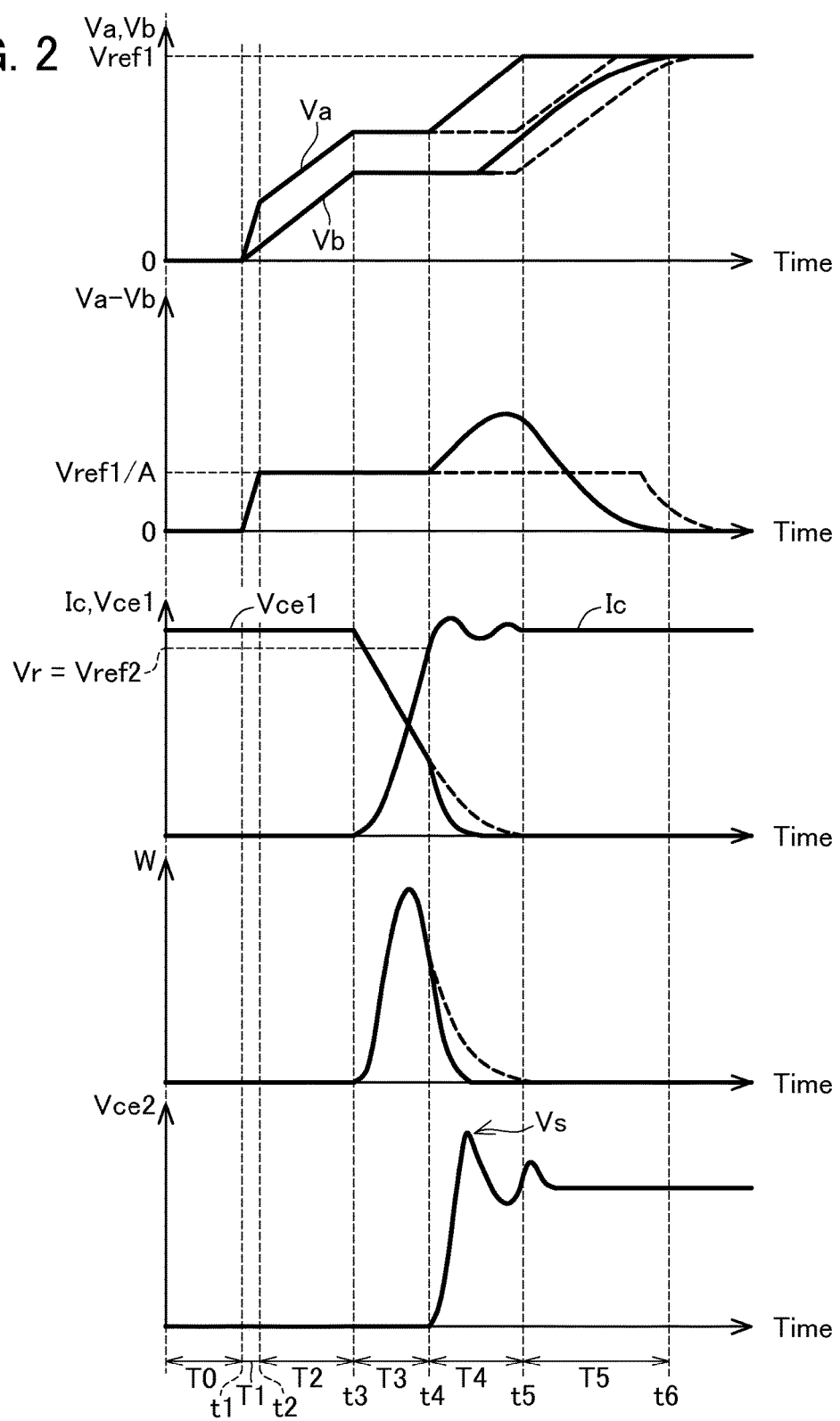
FIG. 2 is a graph showing changes in each value when an IGBT 12 is turned on in the first embodiment.
Figure 3:
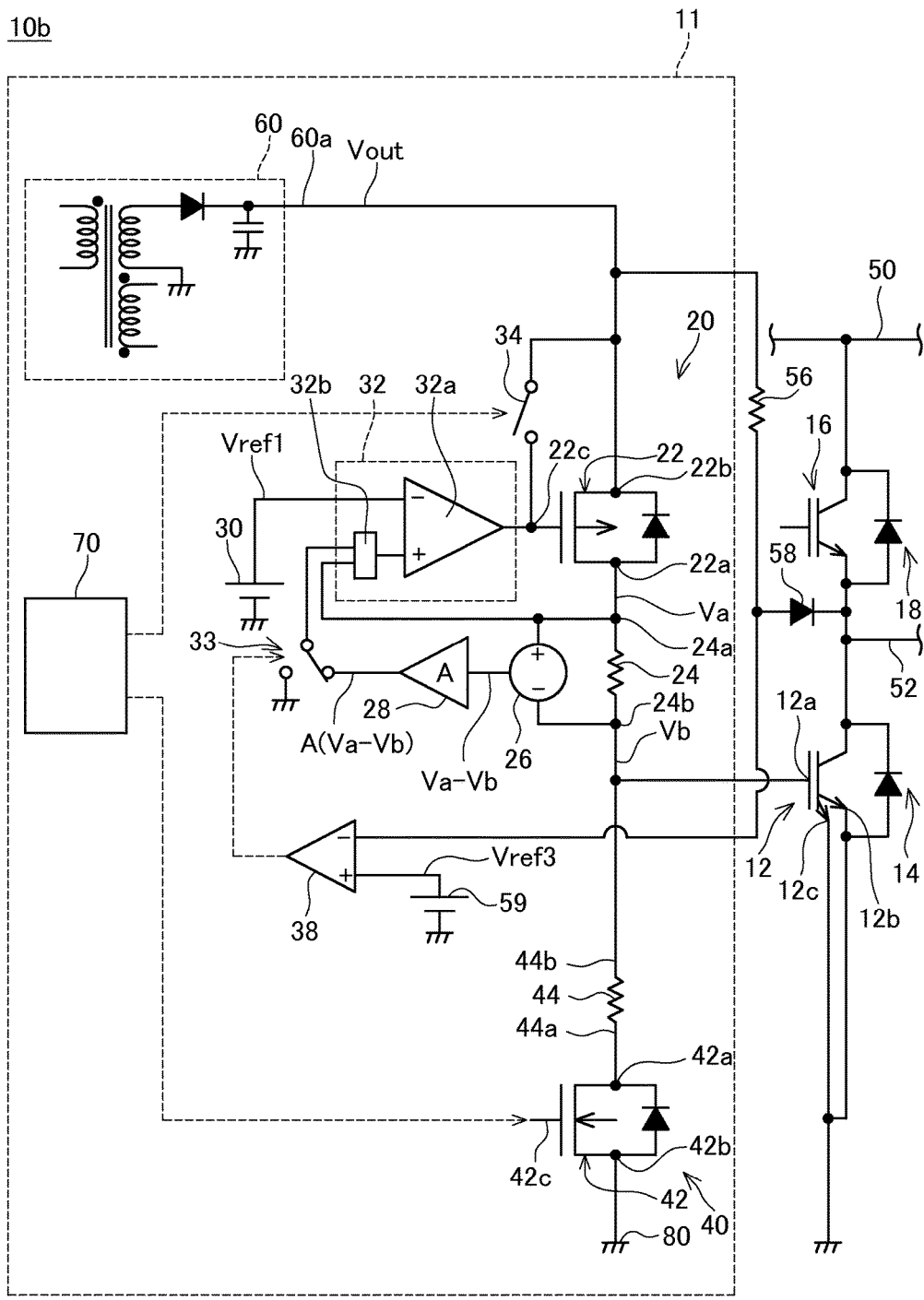
FIG. 3 is a circuit diagram of a current control circuit 10b in a second embodiment.

FIG. 2 shows the potentials Va and Vb, the potential difference Va−Vb, a collector current Ic of the IGBT 12, a voltage Vce1 between the collector and the emitter of the IGBT 12, a loss W produced in the IGBT 12, and a voltage Vce2 between the collector and the emitter of the IGBT 16 when the IGBT 12 is switched from the off state to the on state. Since the potential difference Va−Vb is proportional to the gate current of the IGBT 12, a graph of the potential difference Va−Vb represents changes of the gate current. In FIG. 2, values in a comparative example are indicated by a dotted-line graph.

In a state where the IGBT 12 is off (that is, a period T0), the nMOS 42 is on, and the switch 34 is on (that is, the pMOS 22 is off). Hence, the ground potential (0 V) is applied to the gate 12a of the IGBT 12. Thus, both of the potentials Va and Vb are 0 V. Since the IGBT 12 is off, no current flows through the resistor 54 connected to the sense emitter 12c of the IGBT 12. Hence, the potential Vr is substantially 0 V. Since the potential Vr(=0 V) is lower than the reference potential Vref2, the operational amplifier 38 controls the interruption element 33 such that the interruption element 33 is in the first state (the state where the output terminal of the amplifier 28 is connected to the selector 32b).

At a time t1 in FIG. 2, the control device 70 turns off the nMOS 42 and turns off the switch 34. Since the switch 34 is turned off, the potential of the gate 22c of the pMOS 22 comes to be controlled by the operational amplifier 32a. Since at the time t1, both of the potential Va and the potential A(Va−Vb) are substantially 0 V (the ground potential), the selector 32b outputs substantially 0 V. Hence, substantially 0 V is input to the non-inverting input terminal of the operational amplifier 32a. Since the inverting input terminal has a potential Vref1 higher than the potential (0 V) of the non-inverting input terminal, the operational amplifier 32a lowers the potential of the output terminal (that is, the gate 22c of the pMOS 22). Due to this, the pMOS 22 is turned on, and the gate current flows from the isolated power source 60 through the pMOS 22 and the resistor 24 to the gate 12a of the IGBT 12. When the pMOS 22 is turned on at the time t1, since the gate current is increased in the subsequent period T1, the potential difference Va−Vb is increased. Furthermore, since electric charges are accumulated in the gate 12a as the gate current flows, the potential of the gate 12a gradually increases. Hence, in the period T1, the potentials Va and Vb increase. Since the potential input to the non-inverting input terminal of the operational amplifier 32a is low in the period T1, the operational amplifier 32a lowers the output potential (that is, the potential of the gate 22c) according to a slew rate of the operational amplifier 32a. Hence, in the period T1, a gradient by which the potentials Va and Vb rise corresponds to the slew rate of the operational amplifier 32a. A constant A of the amplifier 28 is set such that the potential A(Va−Vb) is raised faster than the potential Va in the period T1. Hence, during the period T1, the potential A(Va−Vb) is continuously input to the non-inverting input terminal of the operational amplifier 32a.

When the gate current increases in the period T1, the potential difference Va−Vb reaches a value Vref1/A at a time t2. In other words, at the time t2, A(Va−Vb)=Vref1 is satisfied. Then, the operational amplifier 32a controls the potential of the gate 22c so as to maintain A(Va−Vb)=Vref1. Hence, in the period T2 after the time t2, the potential difference Va−Vb is substantially constant at Vref1/A. In other words, the gate current is substantially constant. Hence, in the period T2 after the time t2, the potentials Va and Vb increase at a gradient corresponding to the constant gate current. Here, the rising rate of the potentials Va and Vb in this period is lower than the rate according to the slew rate of the operational amplifier 32a. In a period T3 after a time t3, the potentials Va and Vb proceed at a substantially constant potential, and this is because charges are stored in a Miller capacitance of the IGBT 12. In the period T3, the gate current (that is, the potential difference Va−Vb) is also substantially constant.

When the electric charges start to be charged in the Miller capacitance of the IGBT 12 at the time t3, the voltage Vce1 between the collector and the emitter of the IGBT 12 starts to be lowered, and the collector current Ic starts to flow through the IGBT 12. In the period T3, along with a progress of the electric charges being charged in the Miller capacitance, the voltage Vce1 is lowered and the collector current Ic is increased. As described above, the current flowing through the resistor 54 connected to the sense emitter 12c of the IGBT 12 is substantially proportional to the collector current Ic of the IGBT 12. Hence, when the collector current Ic is increased, the potential Vr is also increased. As shown in a graph of the collector current Ic in FIG. 2, the collector current Ic exceeds a current satisfying Vr=Vref2 at a time t4. When the potential Vr exceeds the reference potential Vref2, the operational amplifier 38 switches the interruption element 33 to the second state. As a result, the output terminal of the amplifier 28 is disconnected from the selector 32b of the operational amplifier IC 32. The interruption element 33 comes to input the potential of the ground connected to the second terminal, to the selector 32b. Then, since the potential Va is higher than the ground potential, the selector 32b comes to input the potential Va to the non-inverting input terminal of the operational amplifier 32a.

When the potential Va is input to the non-inverting input terminal of the operational amplifier 32a at the time t4, the operational amplifier 32a controls the potential of the gate 22c such that the potential Va is raised to the reference potential Vref1. Due to this, in a period T4 after the time t4, the gate current (that is, the potential difference Va−Vb) is increased, and thus the gate 12a of the IGBT 12 is more rapidly charged. Hence, in the period T4, the voltage Vce1 is rapidly lowered. Since the voltage Vce1 is rapidly lowered as described above, the switching loss W produced in the IGBT 12 is reduced in the period T4.

When the potential Va reaches the reference potential Vref1 at a time t5, in the subsequent period T5, the operational amplifier 32a controls the pMOS 22 such that the potential Va is equal to the reference potential Vref1. Hence, during the period T5, the gate current is gradually lowered, and at a time t6 when the potential Vb has increased to a potential equal to the reference potential Vref1, the gate current (that is, the potential difference Va−Vb) is substantially zero. Thereafter, the operational amplifier 32a maintains the state where the potentials Va and Vb are equal to the reference potential Vref1.

As described above, in the current control circuit 10a, in a period (that is, the periods T2 and T3 described above) during which the collector current Ic of the IGBT 12 is lower than the threshold Level (a current value satisfying Vr=Vref1), the operational amplifier 32a controls the gate current of the IGBT 12 at a substantially constant value. In other words, the operational amplifier 32a controls a speed of charging the gate 12a to be substantially constant. Since the charging speed in the periods T2 and T3 is lower than the slew rate of the operational amplifier 32a, the charging speed is hardly affected by the slew rate of the operational amplifier 32a. Hence, even when there are variations in the slew rate of the operational amplifier 32a being used, it is possible to accurately control the speed of charging the gate 12a in the periods T2 and T3. Due to this, it is possible to accurately control the timing (that is, the time t4 in FIG. 2) when a current substantially flows through the IGBT 12. In other words, it is possible to accurately control the timing when the IGBT 12 is turned on. In the period T4 after the collector current Ic exceeds the threshold level (a current value satisfying Vr=Vref2), the operational amplifier 32a increases the potential Va to the reference potential Vref1. The charging speed at this time is a speed corresponding to the slew rate of the operational amplifier 32a. In other words, variations in the slew rate of the operational amplifier 32a cause variations in the charging speed in the period T4. However, since the IGBT 12 is already substantially on in the period T4, even if variations in the charging speed are produced due to a difference in the slew rate, the operation of the circuit is hardly affected. After the collector current Ic of the IGBT 12 has reached the threshold level, since the gate 12a is charged according to the slew rate of the operational amplifier 32a as fast as possible, it is possible to lower the voltage Vce1 of the IGBT 12 faster. The voltage Vce1 is rapidly lowered in this manner, and thus it is possible to reduce the switching loss W produced in the IGBT 12.

As described above, each of the graphs indicated by the dotted lines in FIG. 2 represents the operation of the current control circuit in the comparative example. In the current control circuit of the comparative example, the interruption element 33 is not provided, and the output potential A(Va−Vb) of the amplifier 28 is constantly input to the selector 32b. In the periods T0 to T2, the current control circuit of the comparative example operates in a similar manner to the manner in which the current control circuit 10a of the first embodiment operates. Since the current control circuit of the comparative example does not include the interruption element 33, even when the collector current Ic of the IGBT 12 reaches the threshold level (a current value satisfying Vr=Vref2), the output potential A(Va−Vb) of the amplifier 28 is continuously input to the selector 32b. Hence, in the subsequent periods T4 and T5, the gate current (that is, Va−Vb) is constant. Hence, in the current control circuit of the comparative example, a decreasing rate of the voltage Vce1 of the IGBT 12 is low in the period T4. Thus, the switching loss W produced in the period T4 is great. As described above, in the current control circuit of the comparative example, as compared with the current control circuit 10a in the first embodiment, the switching loss produced in the IGBT 12 is greater.

As described above, in the current control circuit 10a of the first embodiment, it is possible to accurately control the timing when the IGBT 12 is turned on while hardly being affected by the slew rate of the operational amplifier 32a. Further, after the collector current Ic of the IGBT 12 has exceeded the threshold level, the gate voltage of the IGBT 12 is rapidly increased according to the slew rate of the operational amplifier 32a. Thus, it is possible to reduce the switching loss W produced in the IGBT 12. As described above, it is possible by the current control circuit 10a to realize the accurate control of the timing when the IGBT 12 is turned on and the reduction of the switching loss in the IGBT 12.

Meanwhile, when the IGBT 12 on the lower arm is turned on, the diode 18 on the upper arm performs a recovery operation. Due to this, a surge voltage is applied to the IGBT 16 on the upper arm. In other words, as shown in FIG. 2, the surge voltage Vs causes the voltage Vce2 of the IGBT 16 to be instantaneously increased immediately after the IGBT 12 is turned on. The surge voltage Vs is larger as the switching speed of the IGBT 12 is faster. As described above, in the periods T2 and T3 before the IGBT 12 is substantially turned on, the gate current of the IGBT 12 is restricted so as to be a substantially constant value. Due to this, a high surge voltage Vs is prevented from being produced. More specifically, when electrical resistance of the resistor 24 is assumed to be R24, the gate current Ig of the IGBT 12 satisfies Ig=(Va−Vb)/R24. As shown in FIG. 2, in the periods T2 and T3, Va−Vb=Vref1/A is satisfied. Hence, the gate current Ig in the periods T2 and T3 satisfies Ig=Vref1/A·R24. In the current control circuit 10a of the first embodiment, the reference potential Vref1, the constant A and the electrical resistance R24 are set such that the surge voltage Vs does not exceed maximum rated values of the IGBT 16 and the diode 18. Due to this, the protection from the surge voltage Vs is realized.

A relationship between the configurations of the first embodiment described above and the configurations of the claims will be described. The IGBT 12 of the first embodiment is an example of the first drive switching device of the claims. The pMOS 22 of the first embodiment is an example of the control switching device of the claims. The resistor 24 of the first embodiment is an example of the first resistor of the claims. The operational amplifier 32a of the first embodiment is an example of the operational amplifier of the claims. The resistor 54, the operational amplifier 38, the reference power source 39, the interruption element 33 and the selector 32b in the first embodiment are examples of the switching circuit of the claims. The potential A(Va−Vb) of the first embodiment is an example of the value based on the potential difference between both ends of the first resistor. The potential Va of the first embodiment is an example of the value based on the potential on the current pathway between the control switching device and the gate of the first drive switching device in the claims.

Second Embodiment

In a current control circuit 10b of the second embodiment, a circuit that detects the collector current Ic flowing through the IGBT 12 differs from the current control circuit 10a of the first embodiment. The other configurations of the current control circuit 10b in the second embodiment are the same as those of the current control circuit 10a in the first embodiment.

The current control circuit 10b of the second embodiment includes a resistor 56, a diode 58 and a reference power source 59. One end of the resistor 56 is connected to the output terminal 60a of the isolated power source 60. The other end of the resistor 56 is connected to the inverting input terminal of the operational amplifier 38. The anode of the diode 58 is connected to the inverting input terminal of the operational amplifier 38. The cathode of the diode 58 is connected to the motor wiring 52. The reference power source 59 outputs a reference potential Vref3. The positive terminal of the reference power source 59 is connected to the non-inverting input terminal of the operational amplifier 38. The negative terminal of the reference power source 59 is connected to the ground.

In the current control circuit 10b of the second embodiment, in a case where the voltage Vce1 between the collector and the emitter of the IGBT 12 is high (that is, in a case where the IGBT 12 is off), the cathode of the diode 58 has a high potential, and the diode 58 is off. In this case, the output potential Vout of the isolated power source 60 is input to the inverting input terminal of the operational amplifier. The potential Vout is higher than the reference potential Vref3. Since an input value to the inverting input terminal of the operational amplifier 38 is higher than an input value to the non-inverting input terminal of the operational amplifier 38, the operational amplifier 38 controls the interruption element 33 such that the interruption element 33 is in the first state (the state where the amplifier 28 is connected to the selector 32b). When the gate potential of the IGBT 12 is increased and the collector current Ic starts to flow through the IGBT 12, the voltage Vce1 between the collector and the emitter of the IGBT 12 is lowered. When the voltage Vce1 falls below a predetermined value, the diode 58 is turned on. Then, a low potential is input to the inverting input terminal of the operational amplifier 38. Since the input value to the inverting input terminal of the operational amplifier 38 is lower than the input value to the non-inverting input terminal of the operational amplifier 38, the operational amplifier 38 controls the interruption element 33 such that the interruption element 33 is in the second state (the state where the amplifier 28 is disconnected from the selector 32b). As described above, in the current control circuit 10b of the second embodiment, the diode 58 is turned on according to the voltage Vce1 of the IGBT 12, and thus the input value to the inverting input terminal of the operational amplifier 38 is changed. In other words, the current control circuit 10b of the second embodiment controls the interruption element 33 according to the voltage Vce1 of the IGBT 12. Since the voltage Vce1 of the IGBT 12 changes according to the collector current Ic of the IGBT 12, even in such a configuration, it is possible to control the interruption element 33 according to the collector current Ic of the IGBT 12.

When the IGBT 12 is turned on in the current control circuit 10b of the second embodiment, as shown in FIG. 2, respective values change as in the current control circuit 10a of the first embodiment.

A relationship between the configurations of the second embodiment described above and the configurations of the claims will be described. The diode 58, the resistor 56, the operational amplifier 38, the reference power source 59, the interruption element 33 and the selector 32b in the second embodiment are examples of the switching circuit of the claims.

In the first and second embodiments described above, the resistor 24 is connected between the drain 22a of the pMOS 22 and the gate 12a of the IGBT 12. However, the resistor 24 may be connected between the source 22b of the pMOS 22 and the output terminal 60a of the isolated power source 60. Even in this case, inputs of a potential obtained by multiplying the potential difference between both ends of the resistor 24 by a constant number and the potential of the drain 22a of the p-MOS 22 to the selector 32b enables the same operation as in the first and second embodiments.

Although in the first and second embodiments described above, the potential Va of the drain 22a of the pMOS 22 is input to the selector 32b. Alternatively, instead of the potential Va, the potential of the gate 12a of the IGBT 12 may be input to the selector 32b. In other words, instead of the potential Va, a potential of any point on a current pathway extending from the drain 22a of the pMOS 22 to the gate 12a of the IGBT 12 may be input to the selector 32b.

Third Embodiment

Figure 4:
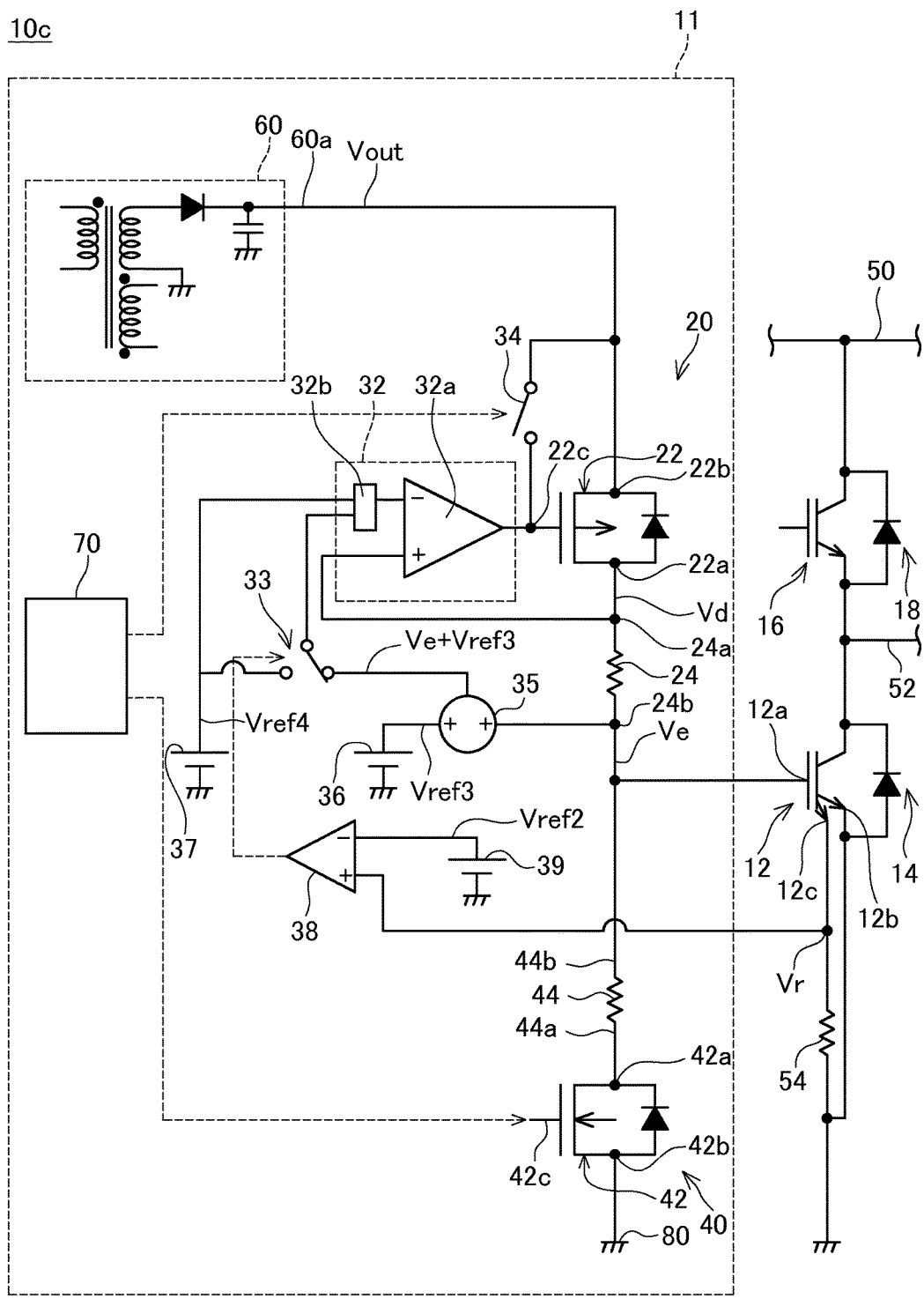
FIG. 4 is a circuit diagram of a current control circuit 10c in a third embodiment.

In a current control circuit 10c of the third embodiment shown in FIG. 4, a gate charge circuit 20 differs from the gate charge circuit 20 of the first embodiment. The other configurations of the current control circuit 10c are the same as in the current control circuit 10a of the first embodiment.

In the third embodiment, the gate charge circuit 20 includes the pMOS 22, the resistor 24, an adder 35, a reference power source 36, the interrupting device 33, a reference power source 37, the operational amplifier IC 32, the switch 34, the operational amplifier 38 and the reference power source 39.

As in the first embodiment, the resistor 24 and the pMOS 22 are connected in series between the gate 12a of the IGBT 12 and the output terminal 60a of the isolated power source 60. A potential Vd shown in FIG. 4 is the potential of the terminal 24a of the resistor 24, and is equal to the potential of the drain 22a of the pMOS 22. A potential Ve shown in FIG. 4 is a potential of the terminal 24b of the resistor 24, and is equal to a potential of the gate 12a of the IGBT 12.

A positive terminal of the reference power source 36 is connected to the adder 35. A negative terminal of the reference power source 36 is connected to the ground. The reference power source 36 outputs the reference potential Vref3.

One input terminal of the adder 35 is connected to the terminal 24b of the resistor 24. The other input terminal of the adder 35 is connected to the positive terminal of the reference power source 36. An output terminal of the adder 35 is connected to the first input terminal of the interruption element 33. The adder 35 outputs, to the output terminal thereof, a potential Ve+Verf3 that is obtained by adding the reference potential Vref3 to the potential Ve of the terminal 24b.

The positive terminal of the reference power source 37 is connected to the selector 32b and the second terminal of the interruption element 33. The negative terminal of the reference power source 37 is connected to the ground. The reference power source 37 outputs a reference potential Vref4. The reference potential Vref4 is higher than the reference potential Vref3.

The output terminal of the interruption element 33 is connected to the selector 32b. The interruption element 33 switches, based on a signal from the operational amplifier 38, the connection state between the first state and the second state. In the first state, the output potential Ve+Vref3 of the adder 35 is input from the interruption element 33 to the selector 32b. In the second state, the reference potential Vref4 is input from the interruption element 33 to the selector 32b.

The potential output by the interruption element 33 and the reference potential Vref4 output by the reference power source 37 are input to the selector 32b. Unlike the first and second embodiments, in the third embodiment, the selector 32b outputs a lower one of the potential output by the interruption element 33 and the reference potential Vref4.

The output potential of the selector 32b is input to the inverting input terminal of the operational amplifier 32a. The potential Vd is input to the non-inverting input terminal of the operational amplifier 32a. The output terminal of the operational amplifier 32a is connected to the gate 22c of the pMOS 22. The operational amplifier 32a outputs a plus potential when the potential of the non-inverting input terminal is higher than that of the inverting input terminal, whereas the operational amplifier 32a outputs a minus potential when the potential of the inverting input terminal is higher than that of the non-inverting input terminal. Due to this, the operational amplifier 32a controls the potential of the gate 22c of the pMOS 22 such that the potential input to the non-inverting input terminal is equal to the potential input to the inverting input terminal.

The switch 34 is connected between the source 22b and the gate 22c of the pMOS 22. The switch 34 switches a wiring between the source 22b and the gate 22c between a conductive state and an interruption state. The switch 34 is controlled by a signal from the control device 70.

The operational amplifier 38 and the reference power source 39 in the third embodiment are configured in the same manner as in the first embodiment.

An operation of the current control circuit 10c will now be described. In the current control circuit 10c of the third embodiment, respective values are changed as shown in FIG. 5.

In a state where the IGBT 12 is off (that is, the period T0), the nMOS 42 is on, and the switch 34 is on (that is, the pMOS 22 is off). Since no current flows through the sense emitter 12c of the IGBT 12, the operational amplifier 38 controls the interruption element 33 such that the interruption element 33 is in the first state (the state where the output terminal of the adder 35 is connected to the selector 32b).

Figure 5:
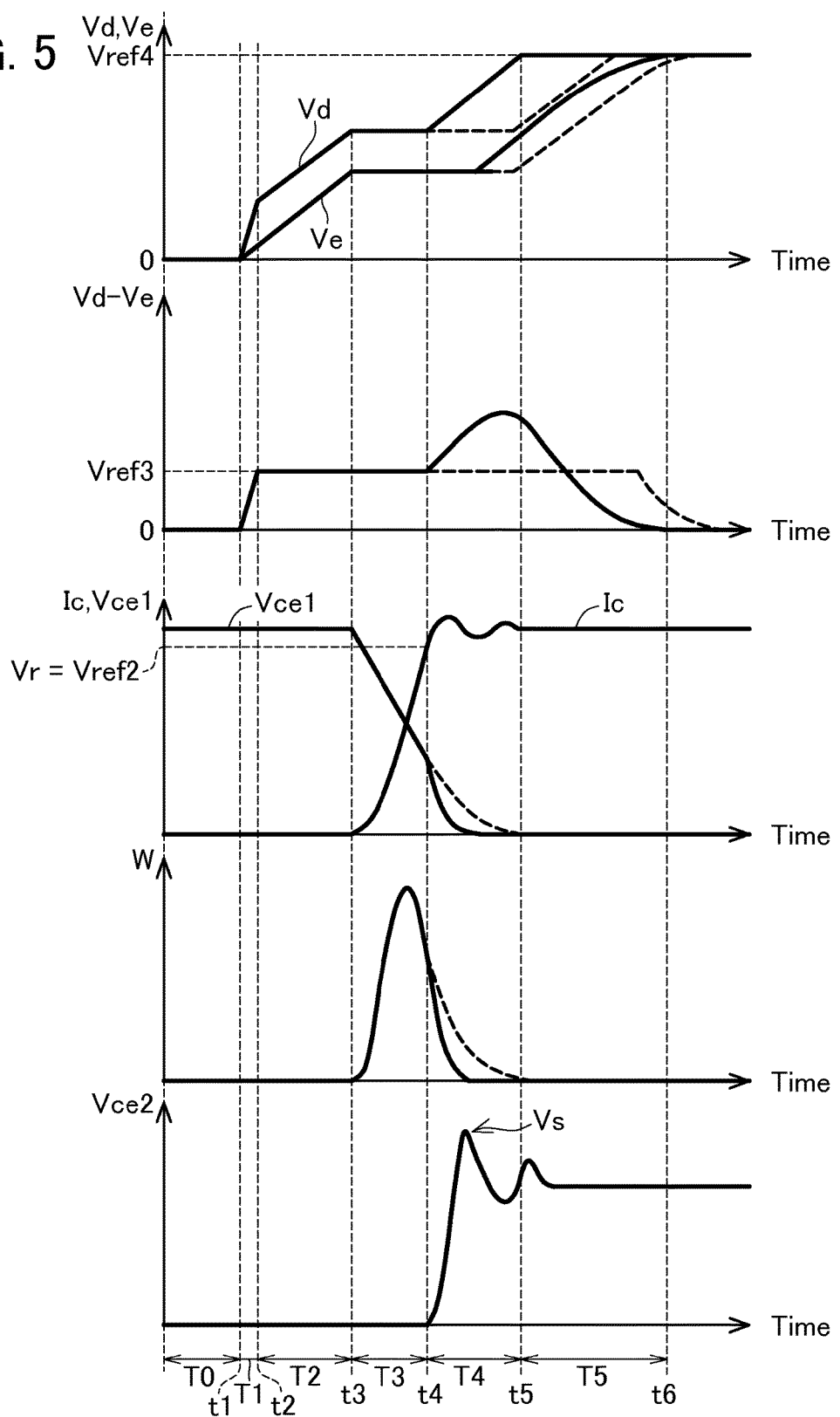
FIG. 5 is a graph showing changes in each value when an IGBT 12 is turned on in the third embodiment.

At the time t1 in FIG. 5, the control device 70 turns off the nMOS 42 and turns off the switch 34. Since the switch 34 is turned off, the potential of the gate 22c of the pMOS 22 become to be controlled by the operational amplifier 32a. Since the potential Ve is substantially 0 V at the time t1, the output potential Ve+Vref3 of the adder 35 is equal to the reference potential Vref3. Since the reference potential Vref3 is lower than the reference potential Vref4, the selector 32b inputs the reference potential Vref3 to the inverting input terminal of the operational amplifier 32a. Since the potential (Vref3) of the inverting input terminal is higher than the potential (Vd=0 V) of the non-inverting input terminal, the operational amplifier 32a lowers the potential of the output terminal (that is, the gate 22c of the pMOS 22). Due to this, the pMOS 22 is turned on, and thus the gate current flows from the isolated power source 60 through the pMOS 22 and the resistor 24 to the gate 12a of the IGBT 12. When the pMOS 22 is turned on at the time t1, since the gate current is increased in the subsequent period T1, the potential difference Vd−Ve is increased. Furthermore, since electric charges are accumulated in the gate 12a as the gate current flows, the potential of the gate 12a is gradually increased. Hence, in the period T1, the potentials Vd and Ve are increased. Since the potential Vd input to the non-inverting input terminal of the operational amplifier 32a is low in the period T1, the operational amplifier 32a lowers the output potential (that is, the potential of the gate 22c) according to the slew rate of the operational amplifier 32a. Hence, in the period T1, a gradient by which the potentials Vd and Ve increase corresponds to the slew rate of the operational amplifier 32a. Thereafter, since the potential Ve+Vref3 is lower than the reference potential Vref4, the potential Ve+Vref3 continues to be input to the inverting input terminal of the operational amplifier 32a.

When the gate current is raised in the period T1, the potential difference Vd−Ve reaches the third reference potential Vref3 at the time t2. In other words, at the time t2, Vd=Ve+Vref3 is satisfied. That is, the potential of the inverting input terminal of the operational amplifier 32a is substantially equal to that of the non-inverting input terminal. Then, the operational amplifier 32a controls the potential of the gate 22c so as to maintain Vd=Ve+Vref3. Hence, in the period T2 after the time t2, the potential difference Vd−Ve is substantially constant at the reference potential Vref3. In other words, the gate current is substantially constant. Hence, in the period T2 after the time t2, the potentials Vd and Ve are raised at a gradient corresponding to the constant gate current. In the period T3 after the time t3, the potentials Vd and Ve proceed at a substantially constant potential, and this is because electric charges are stored in the Miller capacitance of the IGBT 12. In the period T3, the gate current (that is, the potential difference Vd−Ve) is also substantially constant.

When electric charges start to be stored in the Miller capacitance of the IGBT 12 at the time t3, the voltage Vce1 between the collector and the emitter of the IGBT 12 starts to be lowered, and the collector current Ic starts to flow through the IGBT 12. In the period T3, as the charging of the electric charges progresses in the Miller capacitance, the voltage Vce1 is lowered and the collector current Ic is increased. Then, the potential Vr of the resistor 54 is raised. As shown in a graph of the collector current Ic in FIG. 5, at the time t4, the collector current Ic exceeds the current value satisfying Vr=Vref2. When the potential Vr exceeds the reference potential Vref2, the operational amplifier 38 switches the interruption element 33 to the second state. As a result, the output terminal of the adder 35 is disconnected from the selector 32b of the operational amplifier IC 32. The interruption element 33 comes to input the reference potential Vref4 connected to the second terminal to the selector 32b. Then, since the same reference potential Vref4 is input to the two input terminals of the selector 32b, the selector 32b inputs the reference potential Vref4 to the inverting input terminal of the operational amplifier 32a.

When the reference potential Vref4 is input to the inverting input terminal of the operational amplifier 32a at the time t4, the operational amplifier 32a controls the potential of the gate 22c such that the potential Vd is raised to the reference potential Vref4. Due to this, in the period T4 after the time t4, the gate current (that is, the potential difference Vd−Ve) is increased, and thus the gate 12a of the IGBT 12 is more rapidly charged. Hence, in the period T4, the voltage Vce1 is rapidly lowered. Since the voltage Vce1 is rapidly lowered as described above, the switching loss W produced in the IGBT 12 is reduced in the period T4.

When the potential Vd reaches the reference potential Vref4 at the time t5, in the subsequent period T5, the operational amplifier 32a controls the pMOS 22 such that the potential Vd becomes equal to the reference potential Vref4. Hence, the gate current is gradually lowered during the period T5, and at the time t6 when the potential Ve is increased to a potential equal to the reference potential Vref4, the gate current (that is, the potential difference Vd−Ve) becomes substantially zero. Thereafter, the operational amplifier 32a maintains the state where the potentials Vd and Ve are equal to the reference potential Vref4.

As described above, in the current control circuit 10c of the third embodiment, in the periods before the collector current Ic of the IGBT 12 reaches the threshold level (that is, the periods T2 and T3 described above), the gate current of the IGBT 12 is controlled by the operational amplifier 32a to be at a substantially constant value. Due to this, it is possible to accurately control the timing when the IGBT 12 is turned on without being affected by the slew rate of the operational amplifier 32a. In the period T4 after the collector current Ic of the IGBT 12 has exceeded the threshold level, the gate 12a is rapidly charged according to the slew rate of the operational amplifier 32a. Due to this, it is possible to reduce the switching loss W produced in the IGBT 12.

Also in the third embodiment, as in the first embodiment, when the IGBT 12 on the lower arm is turned on, the surge voltage Vs is produced. In the third embodiment also, since the gate current is restricted to be at a substantially constant value in the periods T2 and T3 before the IGBT 12 is substantially turned on, it is also possible to reduce the surge voltage Vs.

A relationship between the configurations of the third embodiment described above and the configurations of the claims will be described. The IGBT 12 of the third embodiment is an example of the first drive switching device of the claims. The pMOS 22 of the third embodiment is an example of the control switching device of the claims. The resistor 24 of the third embodiment is an example of the first resistor of the claims. The operational amplifier 32a of the third embodiment is an example of the operational amplifier of the claims. The resistor 54, the operational amplifier 38, the reference power source 39, the interruption element 33 and the selector 32b of the third embodiment are examples of the switching circuit of the claims. The potential Vd of the third embodiment is an example of the potential of the terminal of the control switching device on the first drive switching device side, in the claims. The potential Ve+Vref3 of the third embodiment is an example of the potential of the claims, which is a sum of the potential of the terminal of the first resistor on the first drive switching device side and the first reference potential. The potential Vref4 of the third embodiment is an example of the second reference potential of the claims.

In the third embodiment described above, the current detection circuit described in the second embodiment may be adopted.

Figure 6:
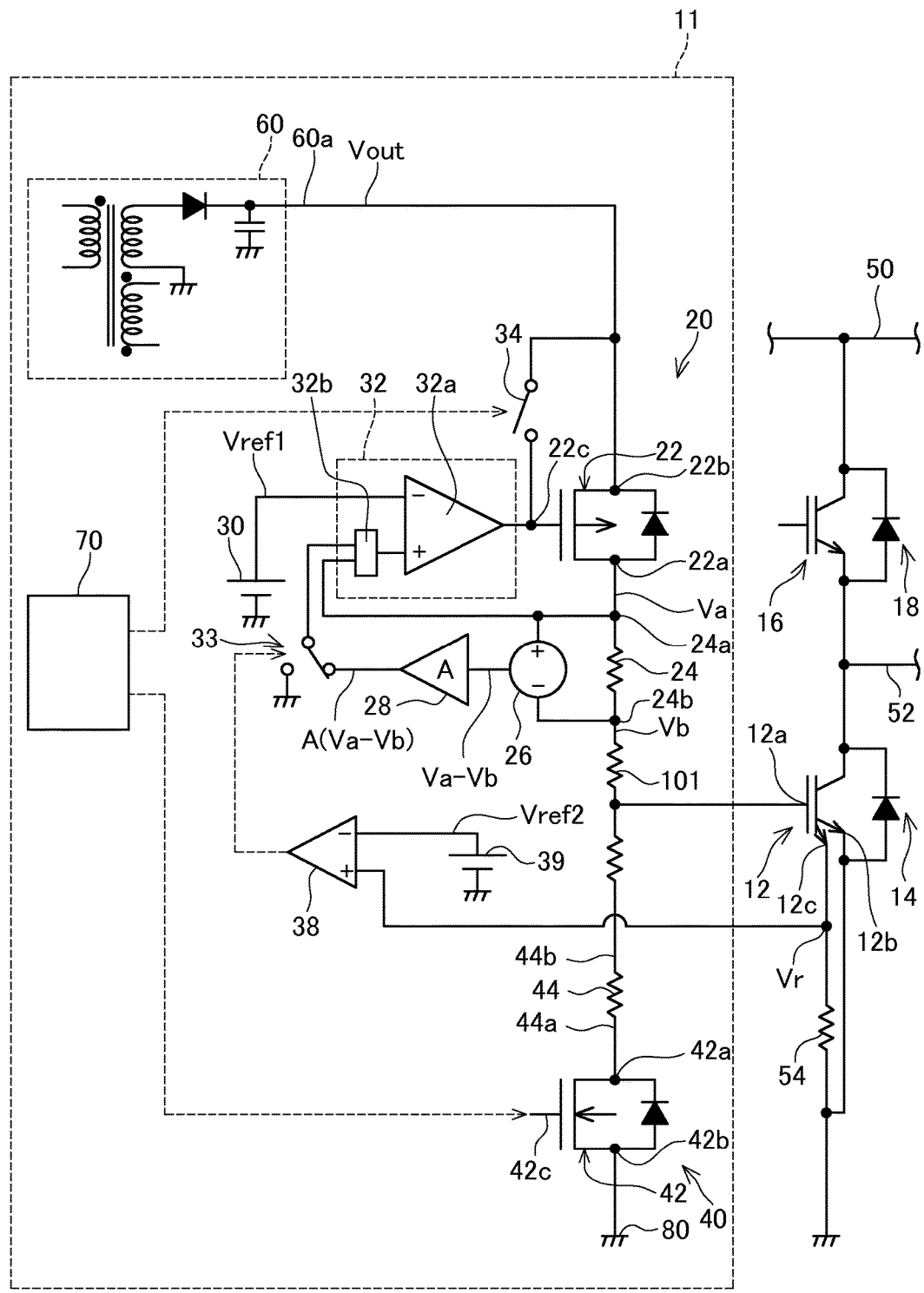
FIG. 6 is a circuit diagram of a current control circuit in a first variation.
Figure 7:
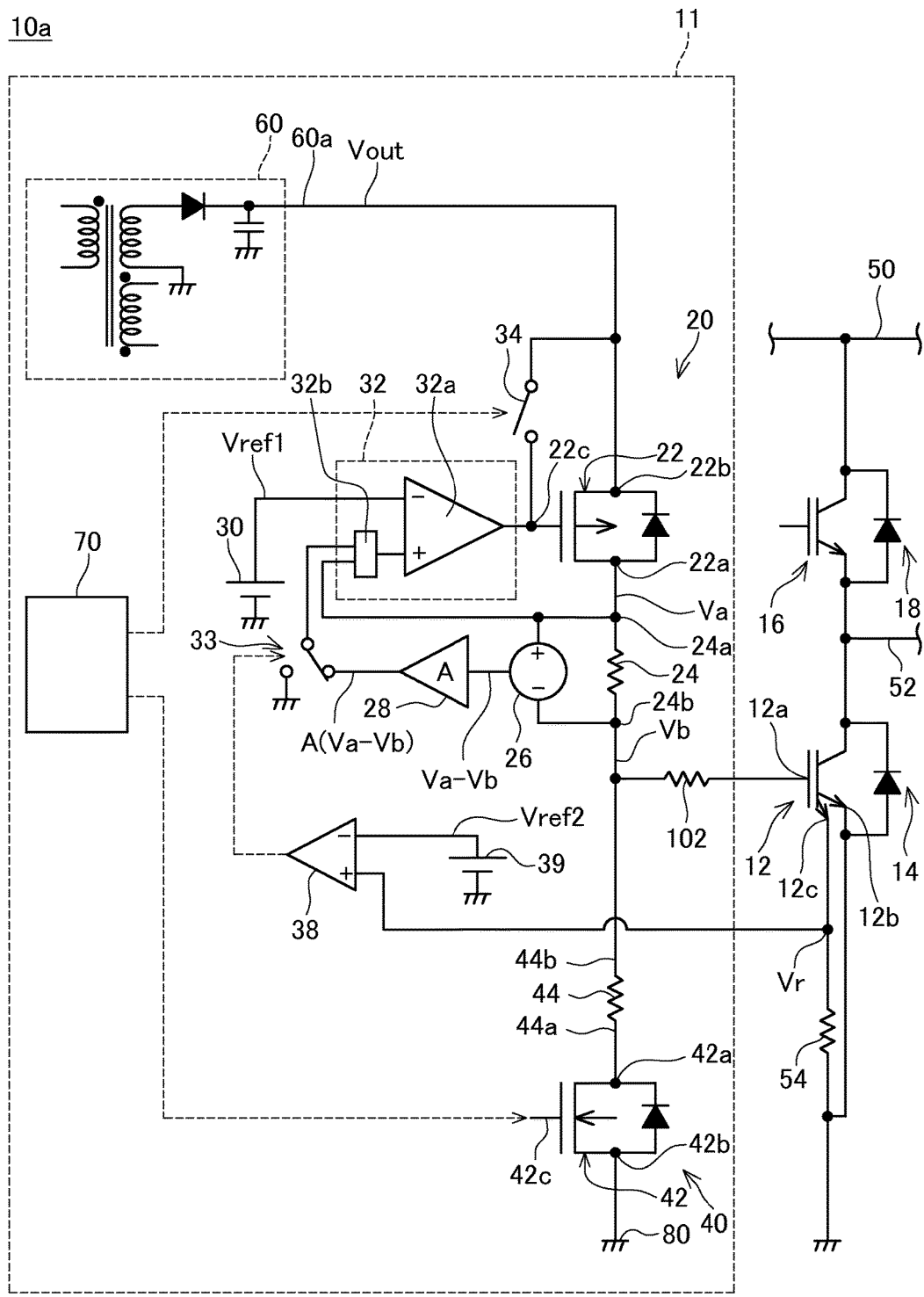
FIG. 7 is a circuit diagram of a current control circuit in a second variation.

In the first embodiment described above, one resistor 24 is connected between the drain 22a of the pMOS 22 and the gate 12a of the IGBT 12. However, as shown in FIGS. 6 and 7, resistors 101 and 102 may further be added therebetween. In the second and third embodiments, the resistors 101 and 102 may be added. In such a configuration, since each of the potential differences between both ends of the resistors 101 and 102 is not input to the operational amplifier, even if resistor values of the resistors 101 and 102 are changed, the operation of the operational amplifier may be hardly affected by the changes. Hence, by replacing the resistors 101 and 102, it is possible to adjust the gate resistor value while the operation of the operational amplifier is little affected. In this way, the flexibility of design is enhanced.

The gate potential control circuit 11 of any one of the first to third embodiments described above may be used to control the gate potential of the IGBT 16 on the upper arm.

Further, the IGBTs 12 and 16 of the first to third embodiments described above may be other switching devices such as a MOSFET.

A configuration of an example disclosed herein may include: a second drive switching device connected to the first drive switching device in series; and a diode connected to the second drive switching device in antiparallel. In such a configuration, it is possible to reduce the surge voltage caused by reverse recovery operation of the diode.

A configuration of an example disclosed herein may further include: a second resistor connected between the control switching device and the gate of the first drive switching device. In such a configuration, it is possible to adjust the gate resistor value without affecting the operation of the operational amplifier.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A current control circuit, comprising:
   a first drive switching device;
   a gate power source;
   a control switching device and a first resistor connected in series between the gate power source and a gate of the first drive switching device;
   an operational amplifier including an output terminal, a non-inverting input terminal, and an inverting input terminal, the output terminal being connected to a gate of the control switching device, and the inverting terminal being configured to receive a reference potential; and
   a switching circuit configured to:
   input a value based on a potential difference between both ends of the first resistor to the non-inverting input terminal of the operational amplifier in a case where a current flowing through the first drive switching device while the gate of the first drive switching device is being charged is equal to or smaller than a threshold level; and
   input a value based on a potential on a current pathway between the control switching device and the gate of the first drive switching device to the non-inverting input terminal in a case where the current flowing through the first drive switching device while the gate of the first drive switching device is being charged is greater than the threshold level.

2. A current control circuit of claim 1, further comprising:
   a second drive switching device connected to the first drive switching device in series; and
   a diode connected to the second drive switching device in antiparallel.

3. A current control circuit of claim 1, further comprising a second resistor connected between the control switching device and the gate of the first drive switching device.

4. A current control circuit, comprising:
   a first drive switching device;
   a gate power source;
   a control switching device and a first resistor connected in series between the gate power source and a gate of the first drive switching device; and
   an operational amplifier including an output terminal connected to a gate of the control switching device,
   wherein the operational amplifier is configured to:
   control a potential of the gate of the control switching device so that a potential difference between both ends of the first resistor does not exceed a first reference value, in a case where a current flowing through the first drive switching device while the gate of the first drive switching device is being charged is equal to or smaller than a threshold level; and control the potential of the gate of the control switching device so that a potential on a current pathway between the control switching device and the gate of the first drive switching device is changed to a second reference value, in a case where the current flowing through the first drive switching device while the gate of the first drive switching device is being charged is greater than the threshold level.

5. A current control circuit of claim 4, further comprising:

a second drive switching device connected to the first drive switching device in series; and a diode connected to the second drive switching device in antiparallel.

6. A current control circuit of claim 4, further comprising a second resistor connected between the control switching device and the gate of the first drive switching device.

* * * * *